US007328769B1

(12) United States Patent
Adamson

(10) Patent No.: US 7,328,769 B1
(45) Date of Patent: Feb. 12, 2008

(54) RIGGING SYSTEM FOR LOUDSPEAKER ARRAYS

(76) Inventor: Alan Brock Adamson, 85 Toronto Street South, Uxbridge Ontario (CA) L9P 1H1

(*) Notice: Subject to any disclaimer, the term of this patent is extended or adjusted under 35 U.S.C. 154(b) by 229 days.

(21) Appl. No.: 10/910,274

(22) Filed: Aug. 4, 2004

(51) Int. Cl.
*H05K 13/04* (2006.01)
*A47B 46/00* (2006.01)
*A47B 57/04* (2006.01)

(52) U.S. Cl. ........................ 181/199; 181/30; 181/144; 181/145; 181/148; 248/274.1; 248/323; 248/324

(58) Field of Classification Search .................. 181/30, 181/144, 145, 199, 148; 248/323, 324, 327, 248/164, 297.31, 299.1, 220.21, 309.1, 274.1, 248/282.1, 284.1, 288.11, 289.11, 291.1, 248/296.1
See application file for complete search history.

(56) References Cited

U.S. PATENT DOCUMENTS 4,660,728 A 4/1987 Martin
4,757,544 A 7/1988 Guy
5,416,284 A 5/1995 Steele et al.
5,714,723 A 2/1998 Kang
5,816,545 A * 10/1998 Malizia ...................... 248/164
6,536,554 B2 3/2003 Andrews
6,536,842 B2 * 3/2003 Bowers et al. ......... 297/344.22
6,640,924 B2 11/2003 Messner
2002/0071580 A1 * 6/2002 Engebretson et al. ....... 381/182
2002/0153195 A1 * 10/2002 Messner ..................... 181/198
2005/0232455 A1 * 10/2005 Monitto et al. ............. 381/335

FOREIGN PATENT DOCUMENTS

GB 2202710 3/1987

* cited by examiner

*Primary Examiner*—Lincoln Donovan
*Assistant Examiner*—Jeremy Luks
(74) *Attorney, Agent, or Firm*—Dowell & Dowell, P.C.

(57) ABSTRACT

A rigging system for angularly adjusting the output portions of a plurality of loudspeaker cabinets wherein each of the cabinets includes a pair of rotatably adjustable rigging disks which protrude outwardly thereof which are selectively receivable within an adjacent cabinet. Each cabinet has a first locking element for securing the disks therein with respect thereto and second locking element or elements for selectively securing protruding portions of disks of an adjacent cabinet whereby an angle of the output portions of each cabinet may be adjusted from substantially a planar orientation to a curved orientation to thereby change the overall wavefront characteristics of sound issuing from a vertical array of attached loudspeaker cabinets.

24 Claims, 7 Drawing Sheets

RIGGING SYSTEM FOR LOUDSPEAKER ARRAYS

BACKGROUND OF THE INVENTION

1. Field of the Invention

This invention is generally directed to rigging systems used to secure a plurality of loudspeakers in a vertical array and more specifically to a rigging system which incorporates speaker mounted disks which may be selectively adjustably rotated and secured in a position to thereby change an angular orientation or tilt angle of loudspeaker cabinets relative to one another without suspension cables and the like. The rigging system is designed in such a manner that a single person may easily configure a plurality of loudspeakers into a predetermined angular relationship in a vertical array depending upon the acoustical characteristics to be obtained within a specific environment.

2. Brief Description of the Related Art

Speakers which are used in environments such as theaters, churches, concert halls and the like are generally arranged relative to one another depending upon the acoustical characteristics of the environment. The speakers which generally have similar audio output characteristics are aligned with respect to one another in order to optimize the audio output characteristics of the speaker system. The relationship of the outputs of the speakers will vary depending upon not only the environment but also based upon the type of transducers being utilized within the speaker housings. By varying the orientation of the outputs of the plurality of speakers, it is possible to alter the audio wavefront characteristics to blend or separate sounds being transmitted in order to obtain optimal sound characteristics.

It is known to provide various suspension systems for speaker arrays, for instance, for supporting a plurality of vertically aligned speakers so as to vary an output angle of the front face of each speaker cabinet to thereby obtain a curved or overlapping wavefront of sound. By way of example, in U.S. Pat. No. 4,660,728 to Martin, a sound system having a suspended array is disclosed wherein cables extend along opposite sides of a plurality of cabinets. Locking elements are provided for securing the cabinets at various positions along the cables in order to vary the spacing or angle of the output portion of the cabinets relative to one another. The cables may be in the form of a suspension chains and are supported by an overhead boom. The inner portions of the speakers are pivotally secured with respect to one another and the lowermost speaker cabinet is engageable with a spaced suspension element which causes an arcuate configuration to be placed on the main suspension cables or chains and thus the speaker array.

Such an arrangement is extremely bulky and complex and requires several people to manipulate to accurately position the speakers relative to one another. Further, there is no predetermined adjustment possible and, therefore, the exact positioning of the speakers relative to one another is not possible without measuring the spacing between each speaker relative to the suspension cables or chains. Such a system is not conducive to quick assembly or disassembly. Also, the speakers must be connected at both their front and rear to one another or the suspension elements.

In order to provide a more internal system for securing speakers in a line array, innovations have been made to rigging systems such that speaker cabinets include onboard connecter elements for securing the speakers to each other in a predetermined angular relationship. By way of example, in U.S. Pat. No. 6,640,924 to Messner, a rigging system is disclosed wherein a plurality of speakers are provided having pivotal adjustment elements including cam plates having a plurality of spaced openings. The plates are pivotally attached at one point to a corner of one speaker and, depending upon the opening in the cam plate selected for securing an adjacent speaker, an angle between the speakers is selectively obtained. Unfortunately, with such a system, the speakers must be connected not only at their forward portion by the adjustable cam plates but must also be pivotally connected at their rear portion to secure the speakers in a predetermined angled relationship relative to one another. Further, the type of adjustment mechanism requires that the speakers be lifted and maneuvered relative to one another in order to adjust the cam plates. This requires additional work on the part of the installer and may often require two or more individuals to set up an array into a predetermined configuration.

Other examples of rigging systems utilized between adjacent speakers are disclosed in U.S. Pat. No. 4,757,544, to Guy, and U.S. Pat. No. 6,536,554, to Andrews at el.

SUMMARY OF THE INVENTION

The present invention is directed to a rigging system for a plurality of loudspeaker enclosures or cabinets. The cabinets may include different types of transducer elements depending upon a specific array, however, the speaker cabinets are designed to include internal adjustable rigging disks which may be selectively rotated in order to vary an angle between adjacent speaker cabinets and wherein a pair of disks associated with each cabinet are selectively engageable by locking elements associated with an adjacent cabinet, which locking elements both secure and stabilize two adjacent cabinets.

Each speaker cabinet of the rigging system includes a pair of upper and lower slots in the upper and lower surface thereof. A left and right pair of disks of each cabinet are rotatably mounted within the cabinet and are designed to either extend downwardly through the slots in the lower wall of the cabinet or upwardly through the slots in the upper wall of the cabinet adjacent to each side of the cabinets. In the preferred embodiments, the disks extend upwardly through the slots in the upper wall of the cabinets such that by placing one cabinet on top of an adjacent cabinet, the protruding portion of each disk extends through the lower slots in the upper cabinet.

Each pair of rotatable rigging disks may be locked in a selected position relative to a cabinet by a first locking element. In some embodiments, a single locking element is provided for each cabinet which locking element is engageable with one or the other of the disks of the cabinet and wherein the disks are interconnected on a common shaft so as to rotate together. In other embodiments, each disk is independently rotatable, in which case, a pair of first locking elements is provided in order to secure the disks in a selectively adjusted position, however, each disk is designed to be rotated to the same degree in order to effect assembly of an array of speaker cabinets.

Each of the speaker cabinets further includes second locking elements for selectively engaging in outer openings in the protruding disk portions of an adjacent speaker cabinet. Spaced stabilizing pins or screws are also provided adjacent each disk receiving slot and are used to engage pairs of notches in each of the disks which are adjacent each outer opening to thereby create two points of stabilized contact adjacent the second locking elements. In this manner, only three points of contact are provided adjacent each side of the cabinet and there is no requirement for spaced pivot connections between adjacent cabinets, as the case with prior art rigging systems. As the first locking elements secure the disks relative to one cabinet and the second locking elements and disk notches rigidly secure the adjacent cabinets in a fixed angular relationship with respect to one another, there is also no need for suspension cables, wires, ropes, chains or the like.

In a preferred embodiment invention, each of the cabinets is somewhat trapezoidal in cross section in a plane taken from the front or output portion of the speaker cabinet to the rear portion thereof such that the upper and lower walls of each cabinet taper toward one another from the front output portion to the rear of the cabinet. In preferred embodiments, this angle is generally approximately 5° both along the upper and lower walls of each cabinet. This allows the cabinets to be retained in close proximity to one another when making angular adjustments in an assembled array.

The rigging disks of the present invention are preferably formed having an outer generally arcuate peripheral portion along which are spaced a plurality of first openings for selectively receiving the second locking elements of the invention. Specifically configured notches are provided on opposite sides of each of the first openings to provide stabilization. Each rigging disk further includes a plurality of inner generally arcuately spaced secondary openings or inner openings for selectively receiving the first locking means which may be in the form of a locking pin insertable through an inner opening which is positioned in a predetermined location relative to one of the outer openings. In this manner, a first set of inner and outer openings are positioned relative to one another and relative to the rotational axis of each disk such that when the first locking elements of a cabinet engage the first inner openings and the second locking elements of an adjacent cabinet engage the first outer openings, the cabinets are connected such that the frontal output portions of each speaker cabinet are aligned in a generally planar array. By changing the rotational position of each of the disks, the cabinets can be pivoted relative to one another to an extent which is determined by the size and configuration of each of the rigging disks.

In preferred embodiments, each of the rigging disks further includes a generally planar outer peripheral portion or segment which is designed to generally align with an adjacent slot in the cabinet in which the rigging disk is mounted so that, when the rigging disks are not in use and the cabinets are dissembled, the rigging disk does not extend outwardly of the cabinet, assuming the disk is rotated such that the flat segment aligns with the adjacent slot in the cabinet.

It is the primary object of the present invention to provide a rigging system for loudspeaker cabinets or enclosures which is designed to be mounted within the speaker cabinets in such a way that no secondary suspension components are required for connecting adjacent speakers to one another in a vertical array and such that all connecting elements are carried by each speaker in an array so that the components are not misplaced during transport, assembly or disassembly of the array.

It is yet another object of the present invention to provide a rigging system for loudspeaker speaker cabinets which allows predetermined angular adjustment to be made between adjacent cabinets very easily and quickly by simply rotating rigging disks to a predetermined position and thereafter locking the disks with locking elements associated with each of the cabinets.

It is also an object of the present invention to provide a method for assembling a plurality of loudspeaker cabinets in a predetermined array wherein the loudspeaker cabinets may be manipulated by a single individual and wherein the angle between adjacent cabinets is easily determined by selected rotational adjustment of rigging disks associated with each cabinet, after which the cabinets may be easily assembled relative to one another.

It is a further object of the present invention to provide a rigging system for loudspeaker cabinets which is of simplified structure when compared to prior art devices and which provides a very cost effective manner for securely engaging a plurality of loudspeaker cabinets in a predetermined vertical array without the use of tools or other implements.

It is another object of the present invention to provide a rigging system for securing loudspeaker cabinets in vertical arrays wherein the rigging components, when not in use, are simply adjusted to a position where they do not interfere with the routine handling, transportation or storage of the cabinets.

BRIEF DESCRIPTION OF THE DRAWINGS

A better understanding of the invention will be had with reference to the accompanying drawings wherein.

DESCRIPTION OF THE PREFERRED EMBODIMENTS

Figure 10:
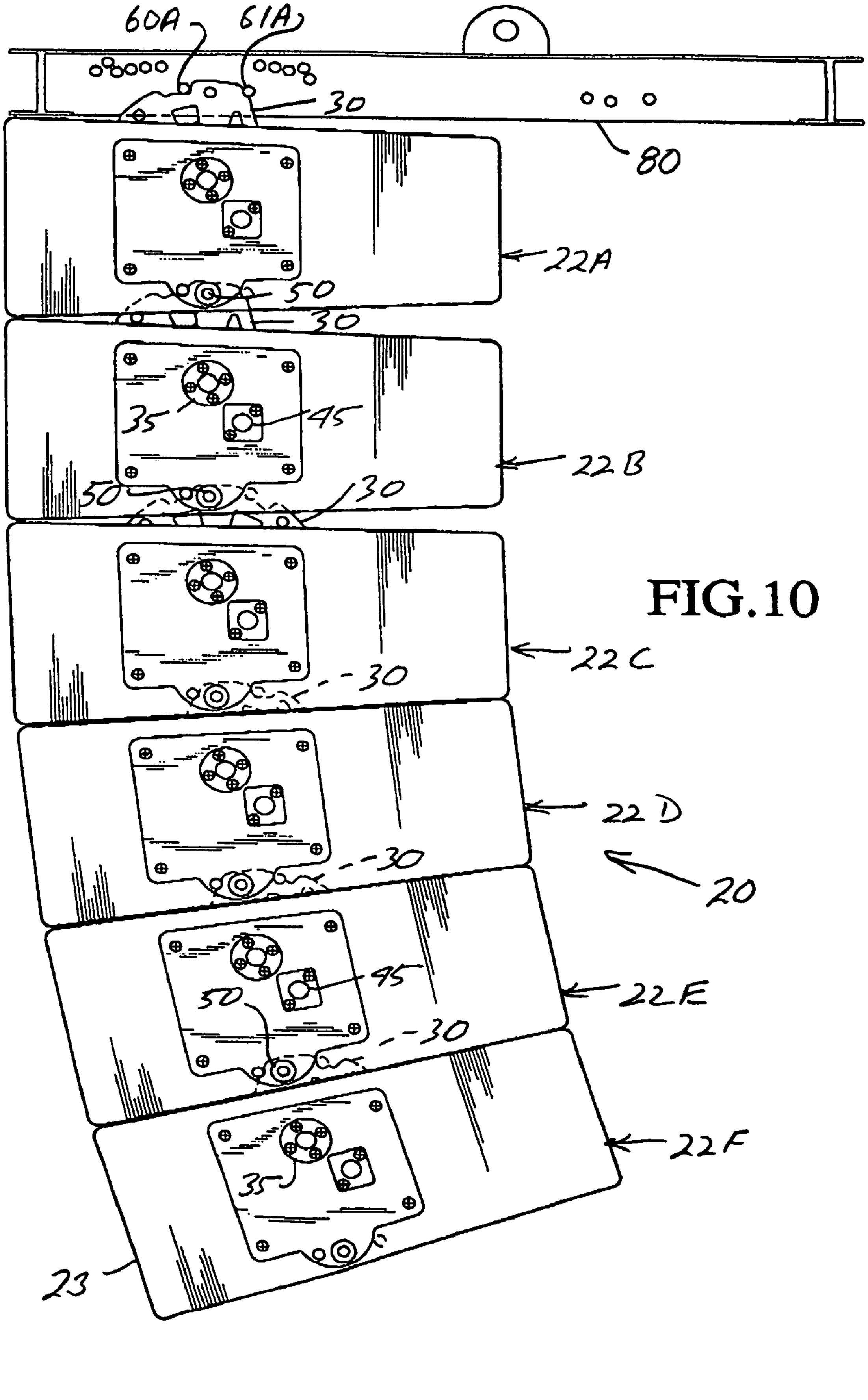
FIG. 10 is an illustrated view of a plurality of vertically arrayed loudspeaker cabinets showing the cabinets being angularly connected to create a curved iso-phase wave emanating from the array.

With continued reference to the drawing figures, the rigging system of the present invention is designed specifically for mounting a plurality of loudspeaker cabinets into a vertical array, such as shown at 20 FIG. 10, wherein the orientation between each loudspeaker cabinet may be set at a predetermined angle or the cabinets may be aligned such that the outputs therefrom form a planar acoustical wavefront as opposed to a slightly curved wavefront as illustrated in the drawing figure.

The present invention incorporates a rigging system which is specifically designed to be retained within each of the loudspeaker cabinets. In this respect, the rigging system does not rely on exterior components to secure the loudspeaker cabinets to one another in a predetermined angular array and, thus, offers a benefit over prior art rigging systems.

Each of the loudspeaker cabinet 22 houses acoustical transducers for generating various sounds at varying frequencies. By way of example, each cabinet in a loudspeaker array may include identical acoustical components such as a low frequency driver, a mid frequency driver and a compression driver.

Each cabinet 22 includes a front output portion 23 and a closed rear wall 24, a top or upper wall 25, which is generally identical to a lower or bottom wall 26, and opposite sides 27 and 28. In preferred embodiments of the invention, the cabinets have a trapezoidal-shape cross-section wherein the upper and lower walls taper inwardly toward one another from the front 23 to the rear 24 of the cabinet. Preferably, the amount or degree of the taper is at an angle of approximately 5° with respect to the horizontal. The tapering of each speaker cabinet provides for a more uniform and closely fit array of speaker cabinets even when angled relative to one another in an array as shown in FIG. 10.

Figure 1:
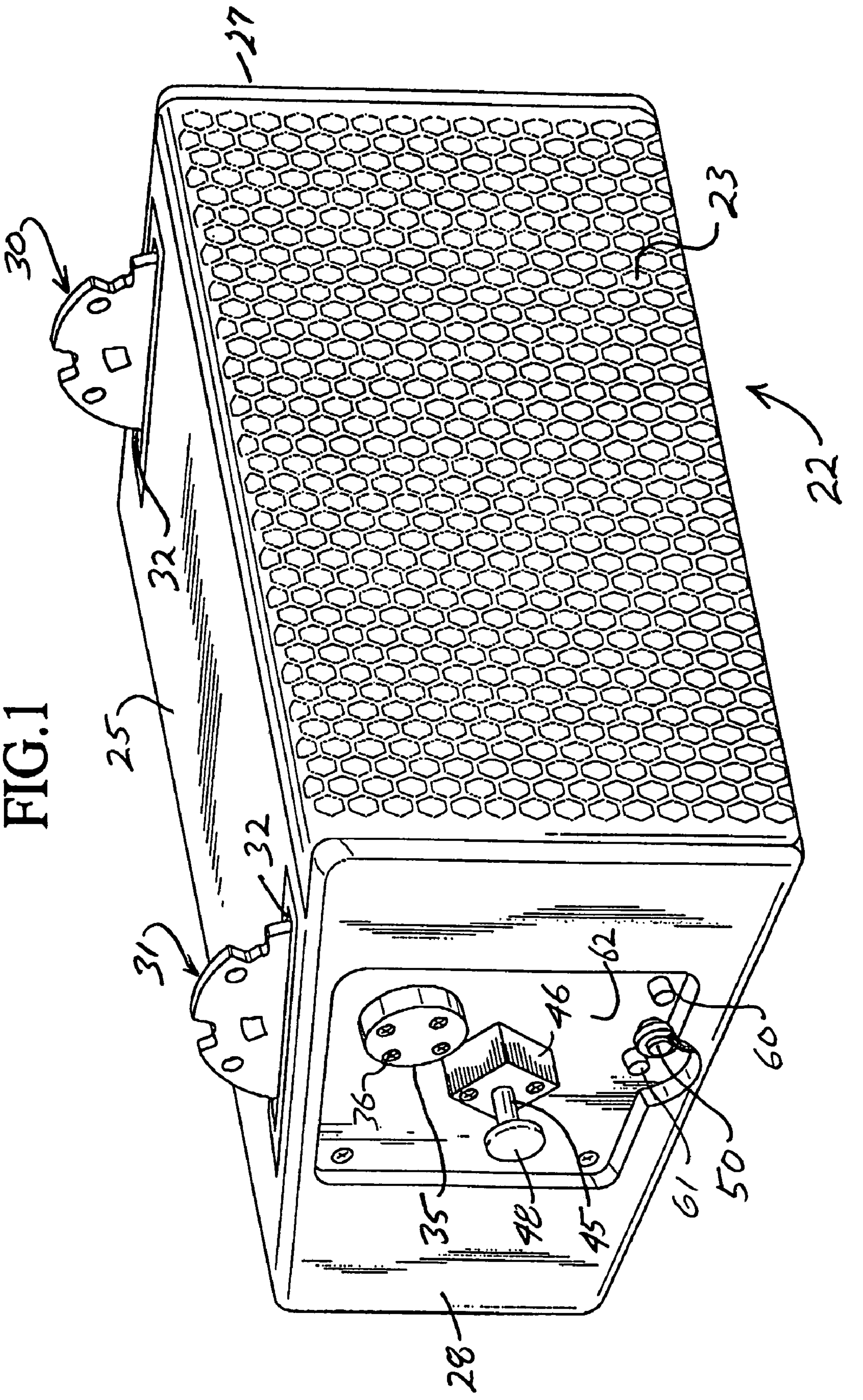
FIG. 1 is a front perspective view of one of the loudspeaker cabinets of the present invention.
Figure 5:
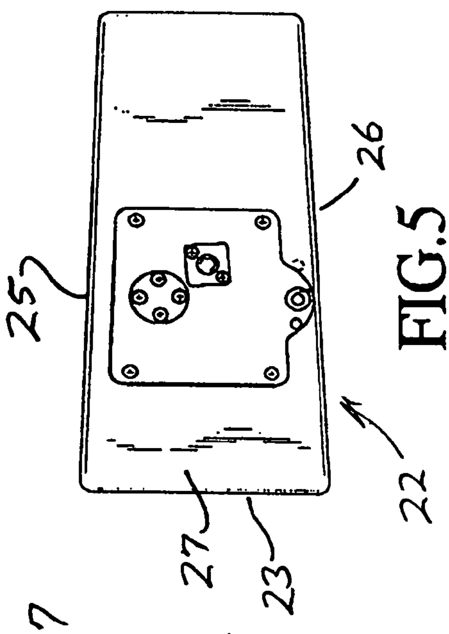
FIG. 5 is a view taken from the left side of the loudspeaker cabinet of FIG. 1.
Figure 4:
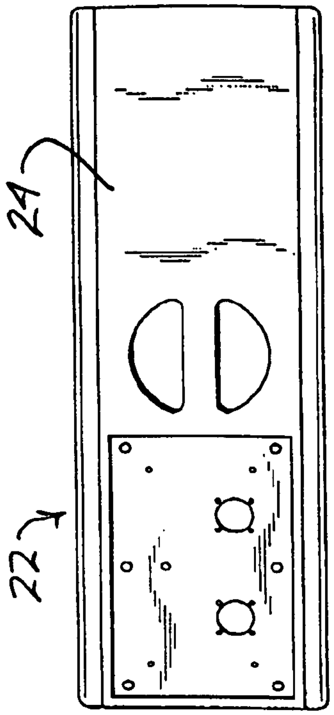
FIG. 4 is a rear elevational view of the loudspeaker cabinet of FIG. 1.
Figure 2:
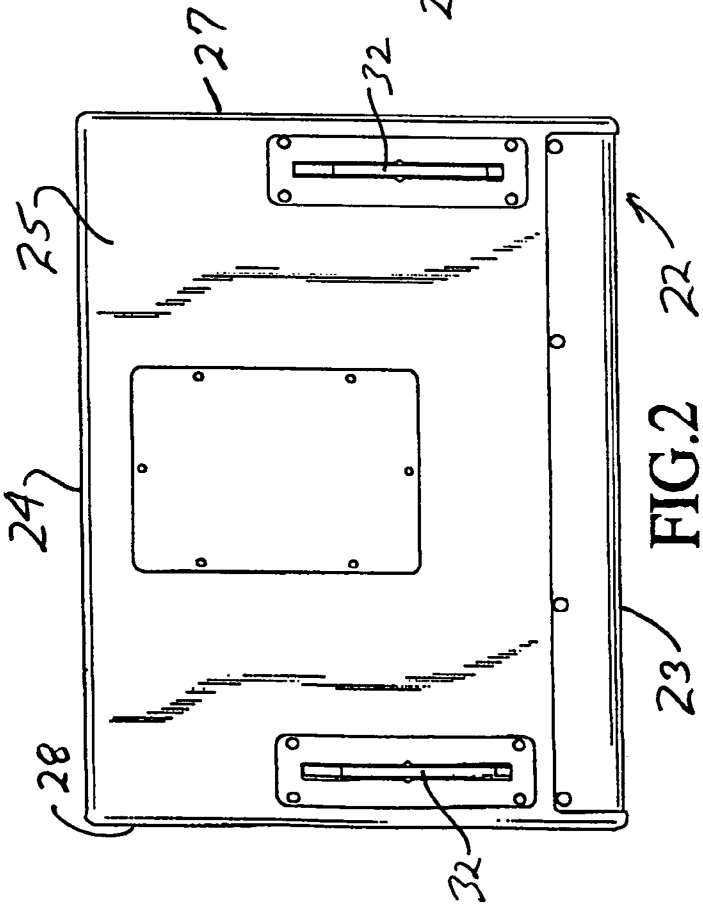
FIG. 2 is a top plan view of the loudspeaker cabinet of FIG. 1, a view taken from the bottom being a mirror image thereof.
Figure 3:
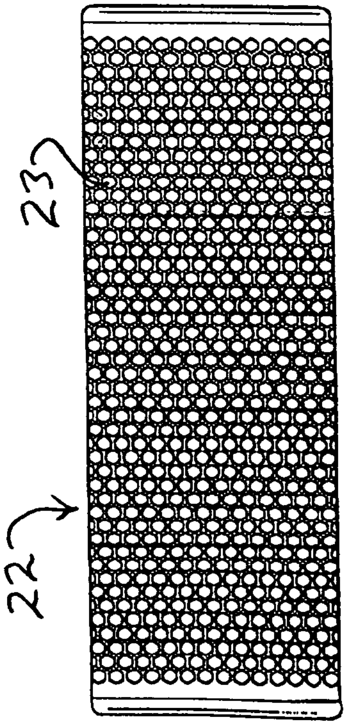
FIG. 3 is a front elevational view of the loudspeaker cabinet of FIG. 1.

The rigging system associated with each cabinet includes a pair of spaced left and right side rigging disks 30 and 31 which are rotatably mounted within the cabinets such that portions of the periphery thereof extend outwardly through slots 32 provided adjacent each side 27 and 28 of the speaker cabinet. The slots 32 are shown in FIG. 1 as being adjacent to the sides and in the upper wall 25 of the cabinet. Similar slots 32 are also provided in the lower wall 26 of the cabinet for purposes of receiving the protruding portion of disks of an underlying speaker cabinet 22. The disks 30 and 31 are generally formed as mirror images of one another.

It should be noted that, although the invention will be described with respect to the rigging disks 30 and 31 protruding from the upper wall 25 of the cabinets, it is possible that the rigging disks may be mounted so as to extend from the slots 32 formed in the lower wall 26 of the speaker cabinets with the upper slots 32 being empty and unobstructed for receiving a protruding portion of a disk extending below a speaker cabinet of a cabinet in an array.

Figures 6A, 6B, 6C:
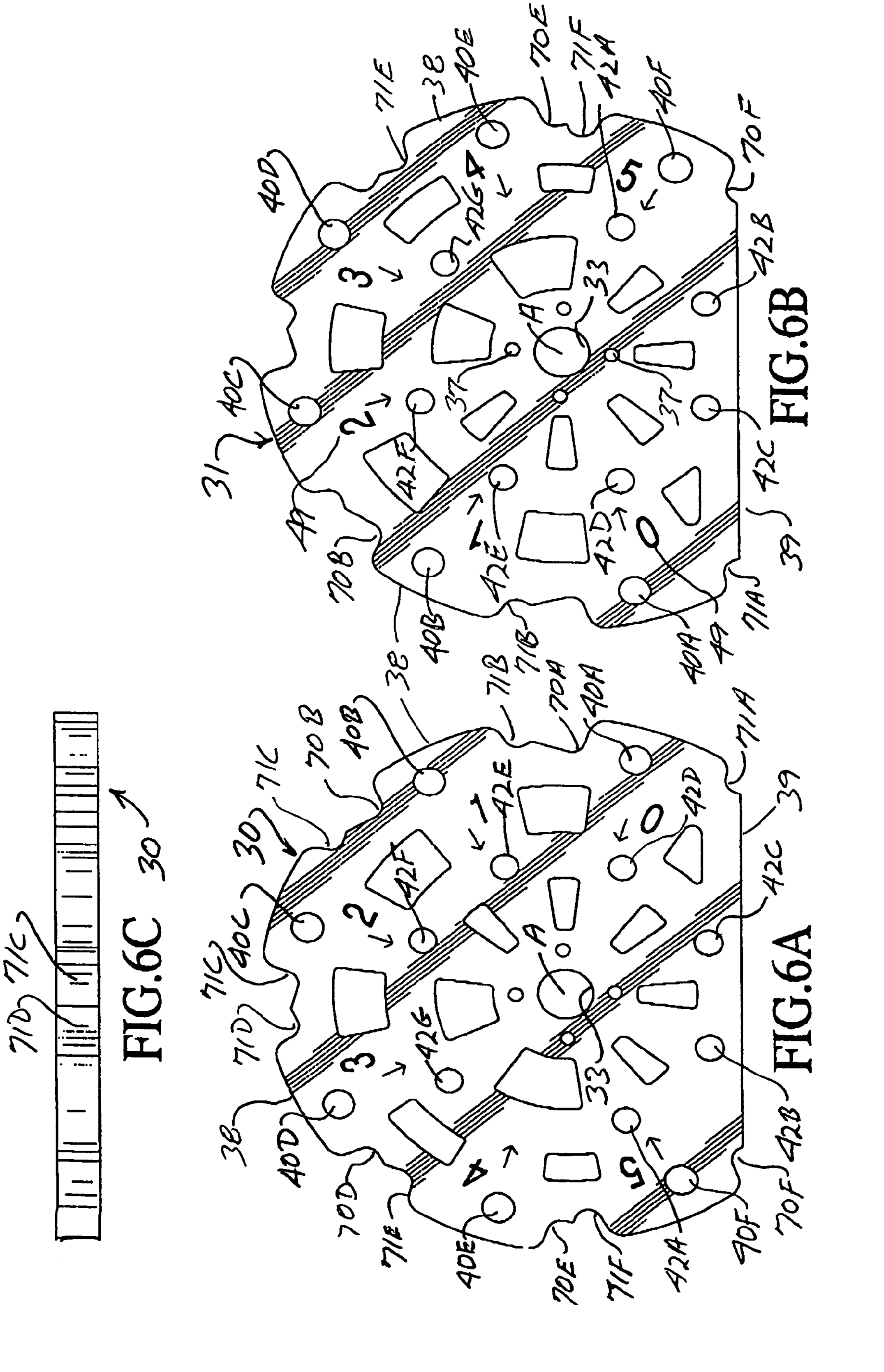
FIG. 6A is a side view of one of a left side rigging disk of the present invention showing the orientation of the various elements of the disk relative to a rotatable axis thereof.
FIG. 6B is a view similar to FIG. 6A showing a right side disk.
FIG. 6C is a top plan view of the disk of FIG. 6A.

With specific reference to FIGS. 6A-6C, the rigging disks 30 and 31 of the present invention are shown in greater detail. Each disk includes a mounting opening 33 which is designed to be seated on a stub shaft 34 which extends to a control knob or handle 35 as shown in FIG. 1. The disk is designed to be securely engaged relative to the operating handle or knob 35 by screws 36 which engage in holes 37 in each disk so that the disk may be easily manually manipulated by rotating the knobs which are easily accessible along the sides of the speaker cabinet.

Each disk includes a somewhat arcuate outer portion 38 and a generally planar portion 39. The generally planar portion 39 is spaced from the rotational axis "A" of the disk a distance such that the planar portion will generally not extend outwardly of the slots 32 when the planar portion is aligned relative to the slots by manipulation of the knob or handle 35. In this respect, the rigging disks may be rotated to a non-obstructing position where no portion thereof extends outwardly of the speaker cabinets when the cabinets are disconnected from an array for purposes of storage or transportation.

Figure 8:
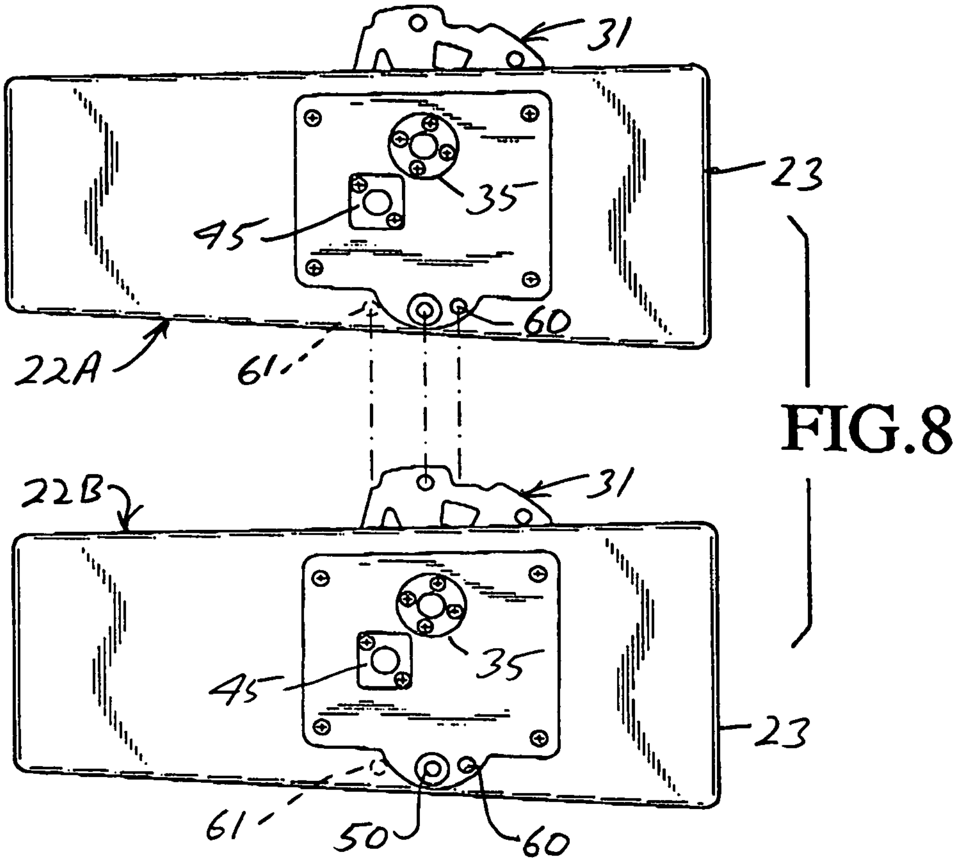
FIG. 8 is an assembly view of a pair of adjacent loudspeaker cabinets prior to being secured relative to one another utilizing the rigging system of the present invention.
Figure 9:
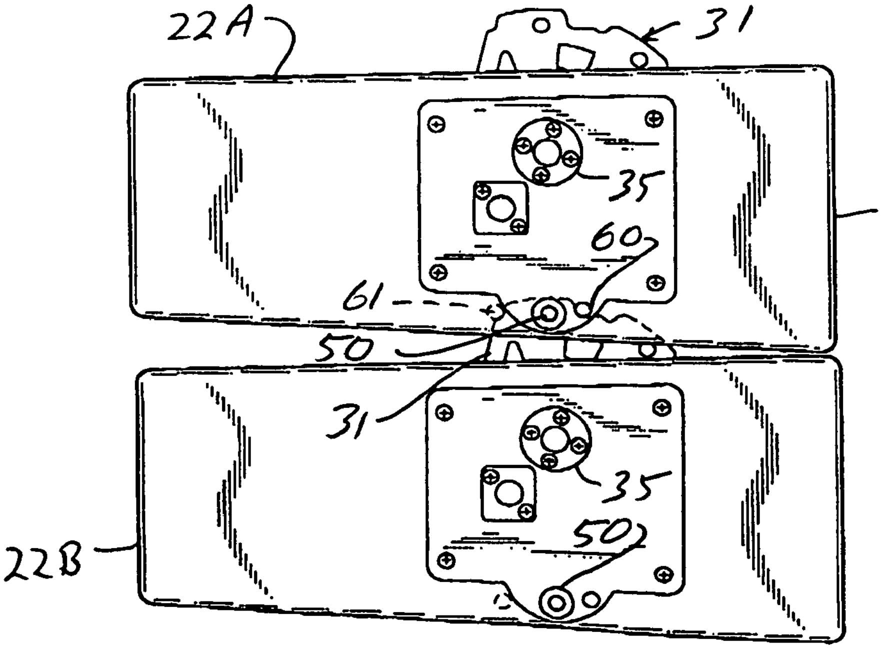
FIG. 9 is a view similar to FIG. 8 wherein two adjacent loudspeaker cabinets have been assembled using the rigging system of the present invention and wherein the front output portions of the speakers are shown as being aligned in a planar array.

Each rigging disk 30 and 31 further includes a plurality outer angularly spaced openings 40A-40F which are aligned in predetermined orientations with respect to the rotational axis "A" of each disk such that when a selected one of the openings 40A-40F are positioned outwardly of the speaker cabinet, as is illustrated in FIGS. 8 and 9, the opening is aligned to be secured by a locking element associated with an adjacent speaker cabinet, as will be described in greater detail hereinafter. In the embodiment shown, there are six adjustment positions with respect to the rigging disk which create six angles of orientation between adjacent cabinets. Opening 40A is positioned or oriented relative to the central axis "A" such that when a disk is rotated to expose the opening 40A relative to an adjacent speaker cabinet, locking of the cabinets relative to the opening 40A will cause the front output portion of the speakers to be aligned generally as shown in FIG. 9, wherein they are in planar relationship with respect to one another. By rotating the rigging disk to align the various other openings 40B-40F relative to the adjacent speaker, different angles are created between the speaker cabinets in order to orient the output portions thereof to create a more curved iso-phase wave output over the full extent of the speaker array 20.

Each rigging disk further includes a plurality of inner openings designated 42A-42G which are used to receive a first locking element associated with each speaker cabinet for locking the rigging disk in non-rotatable relationship with respect to the cabinet.

With reference to FIGS. 1-7 and 11, the first locking element or device may include a locking pin or rod 45 that extends through a mounting bracket 46 provided on in each side of the housing or speaker cabinet. A spring 47 is shown and is designed to normally urge the pin 45 inwardly of the cabinet such that, to disengage the pin from an associated rigging disk, force must be applied on the handle 48 associated with the locking pin to urge the pin outwardly relative to the side of the speaker cabinet whereby the pin is disengaged from one of the rigging disk locking inner openings 42A-42G. When the locking pin 45 is disengaged, the rigging disk may be rotated by manipulation of the knob or handle 35 until a predetermined outer opening is aligned exteriorly of the speaker cabinet. To facilitate alignment, indicia 49 may be applied at various points on the outer portion of the disk which represents predetermined set angles of adjustment for the rigging disk, as shown in FIGS. 6A and 6B. It should be noted that disks 30 and 31 are reversely formed so as to be mirror images of one another.

In the embodiment being described, each of the rigging disks includes its own separate locking pin 45. It is possible, in some embodiments, that two rigging disks of each speaker cabinet may be mounted on a common support shaft such that they may be rotated simultaneously by a single knob 35 extending from only one side of the speaker cabinet. In such embodiments, only a single locking pin 45 may be necessary to engage within an inner opening 42A-42G in order to lock the rigging disks relative to the cabinet.

Figure 7:
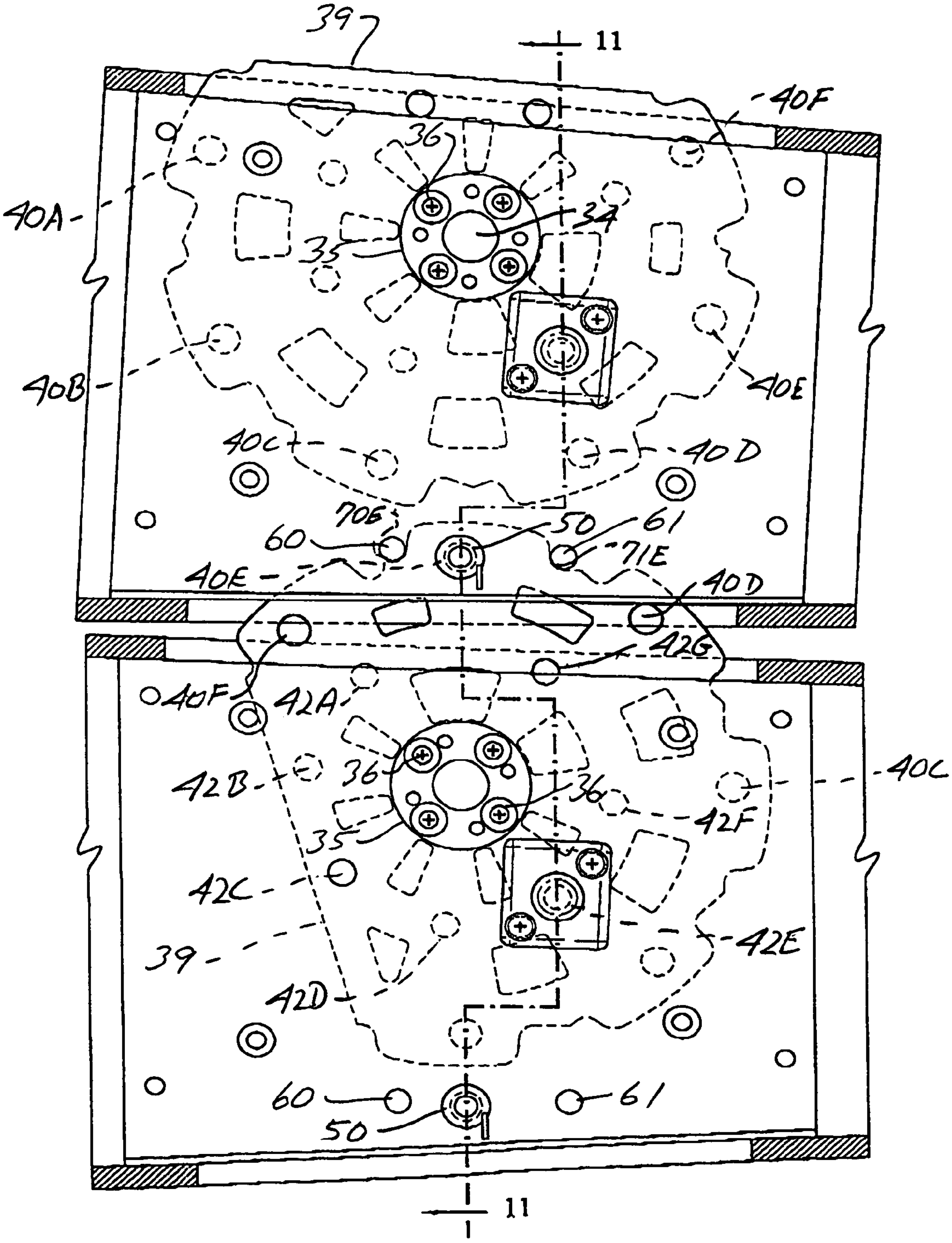
FIG. 7 is a partial cross sectioned view illustrating, the manner in which the rigging disks of the invention are locked and stabilized with respect to an adjacent cabinet in an array.

As previously mentioned, the outer openings 40A-40F in each rigging disk are specifically oriented to provide a different angle between adjacent speaker cabinets in an array. The openings 40A-40F are generally not aligned on a radius with the openings 42A-42G due to an offset position of the locking pin 45 relative to the rotational axis of "A" the disk. As shown in FIG. 7, when the rigging disk 30 is rotated such that the outer opening 40E is oriented outwardly of the speaker cabinet, the inner opening 42E is aligned to receive locking pin 45 to secure the rigging disk in position. Similarly, when the rigging disk is rotated such that outer opening 40A is aligned to be secured to an adjacent cabinet, inner opening 42A is aligned to receive a locking pin 45 to retain the rigging disk in position. A similar cooperation and orientation exists between outer and inner openings 40B and 42B, 40C and 42C, 40D and 42D, and 40F and 42F. Inner opening 42G is provided for securing a disk in a position wherein the planar edge 38 is aligned with the slot 32 in the upper portion of the cabinet, as shown by the upper disk in FIG. 7.

In order to securely connect one speaker cabinet to an adjacent cabinet, each cabinet carries second locking elements or pins, such as ball alignment pins 50 which are manually engageable at each of the opposite sides of the cabinet. The locking pins 50 are designed to be removably pulled from the side walls of the housing and are selectively insertable into an aligned opening 40A-40F of a protruding portion of a rigging disk extending from an adjacent speaker cabinet, once the rigging disk is inserted into the slot 22 adjacent to the locking pin 50. It is preferred that locking pins 50 be provided at both sides of the speaker cabinet in order to provide support on each side of the speaker cabinet in an array of cabinets.

Figure 11:
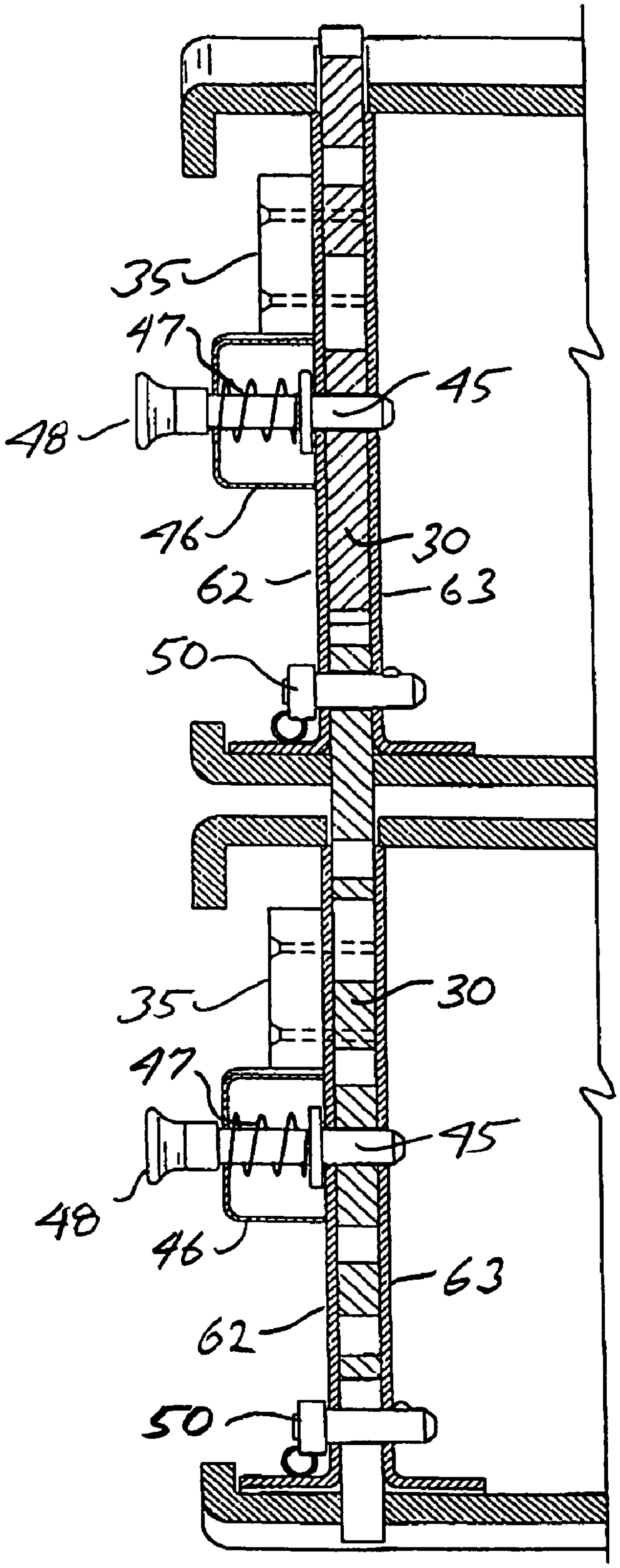
FIG. 11 is a cross sectional view taken along lines 11-11 of FIG. 7.

To securely stabilize the cabinets 22 relative to one another when joined in an array, each cabinet includes a pair of spaced stabilizing pins, rods, screws, rivets or the like 60 and 61 which extend between spaced disk mounting plates 62 and 63, see FIGS. 7 and 11. The plates are secured at each of the sides of the cabinets. As shown in FIG. 8, prior to assembling two adjacent cabinets, each disk is rotated to a desired position and locked into place with the locking pins 45. Thereafter, the upper cabinet 22A is positioned over the lower cabinet 22B and lowered until the disks 30 and 31 of the lower cabinet engage the stabilizing pins 60 and 61 of the upper cabinet, as shown in FIG. 9. In this position, the locking pins 50 are used to lock the disks to the upper cabinet 22A.

To prevent relative pivotal movement of the cabinets 22A and 22B, the stabilizing pins 60 and 61 engage the disks 30 and 31 at spaced points on opposite sides of the locking pins 50. To further anchor the disks relative to the pins 60 and 61, each disk has a plurality of spaced notches or seats 70A/71A-70F/71F provided on opposite sides of each of the outer openings 40A-40F in which the pins 60 and 61 are seated. This arrangement provides a secure and stabilized connection between two adjacent cabinets with three points of contact on each side of the cabinet. The primary points of the contact are between the pins 60 and 61 and the pairs of notches 70A/71A-70F/71F of disks 30 and 31 and between the locking pins 50 and the disks.

With specific reference to FIGS. 6A and 6B, the depth and/or configuration of each of the notches varies in order to provide a predetermined "pitch" angle between the lower cabinet 22B and the upper cabinet 22A. Thus, and by way of example only, when the disks of the lower cabinet are fixed to expose outer openings 40A for locking with the upper cabinet, the pins 60 and 61 will rest in spaced notches 70A/71A which will create a pitch of approximately 0-0.28° between the cabinets such that the output portions of the cabinets are generally or substantially coplanar as shown in FIG. 9. By rotating the disks of the lower cabinet so that the outer openings 40B are aligned for locking with the upper cabinet, the pins 60 and 61 of the upper cabinet will rest in notches 70B/71B which will create a pitch or tilt angle of approximately 0.05°.

An adjustment of the pitch or tilt angles to approximately 5.00°, or greater, may be obtained using the invention. The cooperation between notches 70C/71C and pins 60 and 61, when the lower disks are set to lock at 40C, will create a pitch of approximately 0.89°; between notches 70D/71D and pins 60 and 61, when the lower disk is set to lock at 40D, approximately 1.58°; between notches 70E/71E and pins 60 and 61, when the lower disk is set to lock at 40E, approximately 2.81°; and between notches 70F/71F and pins 60 and 61 when the lower disks are set to 40F, approximately 5.00°.

The six positions of adjustment of each disk 30 and 31 are reflected by the indicia as shown at 0,1,2,3,4 and 5 on the drawings of FIGS. 6A and 6B. Arrows for each position are also shown. In FIG. 9, the disks of cabinet 22B are at their "O" position.

With reference to FIG. 10, a vertical array of loudspeaker cabinets 20 is shown depending from a support frame 80. The frame 80, in use, is elevated to lift the array to a desired height. The cabinets are shown such that the two uppermost cabinets 22A and 22B are joined as described with respect to FIGS. 8 and 9. Cabinets 22C-22F are shown connected at different angles so as to create an array that presents a continuously curved wavefront which is a combination of sound energy from the six loudspeaker cabinets.

As shown in FIG. 10, the frame 80 also includes stabilizing pins 60A and 60B for resting or seating in the spaced notches 70A/71A-70F/71F of the disks. Further, a locking pin, such as those shown at 50, would be used to lock the uppermost disk 30 to the frame.

When it is desired to disconnect the speaker cabinets from one another, the locking pins 50 are removed thereby disconnecting the cabinets. After which, the locking pins 45 may be disengaged with respect to the rigging disks 30 and 31 so as to permit the disks to be rotated to a non use position wherein the flat portions 38 thereof align with the slots 32 in the speaker cabinets.

As described, no tools are necessary to effect the assembled relationship between the cabinets. Further, the cabinets need only to be connected using the two locking pins 50 as described.

The foregoing description of the preferred embodiments of the invention has been presented to illustrate the principles of the invention and not to limit the invention to the particular embodiments illustrated. It is intended that the scope of the invention be defined by all of the embodiments encompassed within the following claims and their equivalents.

I claim:

1. A rigging system for a vertical array of audio speaker cabinets where each cabinet includes an outer housing having a front output portion, rear wall, opposite sides, upper wall and bottom wall, a pair of generally parallel spaced slots formed in each of said upper and lower walls of said housing, a pair of spaced rigging disks mounted within each of said housings, each of said rigging disks including a plurality of outer openings that are spaced in an arcuate manner about an axis of rotation thereof, each of said rigging disks being selectively rotatable about said axis of rotation within said housing to thereby cause a selected outer opening thereof to be deployed from within said housing outwardly thereof so as protrude either upwardly through one of said pair of slots in said upper wall or downwardly through one of said pair of slots in said bottom wall such that either said slots in said upper or said lower walls remain open, each cabinet including first locking means for securing said disks in a predetermined position therein to thereby retain said selected outer openings of said disks in protruding relationship from said housing and second locking means to securely engage within said protruding selected outer openings of a pair of rigging disks extending from an adjacent cabinet which are selectively received within the open slots whereby an angle relative to said front output portions of a vertical array of said cabinets may be selectively varied.

2. The rigging system of claim 1 wherein said rigging disks are mounted adjacent said opposite sides of said housing generally intermediate said front output portion and said rear wall, and each cabinet in a vertical array being connected to an adjacent cabinet by only one pair of rigging disks.

3. The rigging system of claim 2 wherein the said upper and lower walls of each of said cabinets taper inwardly from said front output portions toward said rear wall toward one another, and said upper and lower walls taper inwardly relative to one another at angles up to approximately 5°.

4. The rigging system of claim 1 wherein each cabinet includes at least one manually engageable means operatively connected to said rigging disks mounted therein for selectively rotating said rigging disks when said first locking means is in a released non-locking position permitting rotation of said rigging disks.

5. The rigging system of claim 4 wherein each cabinet includes a pair of manually engageable means, said manually engageable means being connected to opposite ones of said rigging disks.

6. The rigging system of claim 1 wherein said plurality of spaced outer openings therein are generally equally spaced outwardly of said axis of rotation of said rigging disks which are selectively exposed outwardly of said cabinet upon selective rotation of said rigging disks.

7. The rigging system of claim 6 wherein said second locking means includes a pair of locking pins selectively moveable relative to said opposite sides of each of said housings to selectively engage in said outer openings of said rigging disks of an adjacent cabinet.

8. The rigging system of claim 7 wherein each of said rigging disks includes a plurality of arcuately spaced inner openings for selectively receiving said first locking means and which are generally equally spaced relative to said axis of rotation.

9. The rigging system of claim 8 wherein said outer openings are not radially aligned relative to said inner openings relative to said axis of rotation of said rigging disks.

10. The rigging system of claim 8 wherein said first locking means of each cabinet includes at least one first locking pin movably receivable relative to at least one of said opposite sides.

11. The rigging system of claim 10 wherein each cabinet includes a pair of first locking pins extending through said opposite sides for separately engaging said pair of rigging disks.

12. The rigging system of claim 8 wherein each of said cabinets includes at least one disk engaging stabilizer means mounted within said housing for engaging said rigging disks to thereby maintain a positioning relationship between vertically adjacent cabinets and prevent pivotal movement of adjacent cabinets when said rigging disks of one cabinet are inserted within said open slots of an adjacent cabinet.

13. The rigging system of claim 12 wherein each of said rigging disks includes a plurality of pairs of notches in a peripheral portion thereof, said pairs of notches being provided on opposite sides of each of said first outer openings, and said stabilizer means within each of said cabinets including means for engaging within said pairs of notches when said rigging disks of said one cabinet are inserted with said open slots of said adjacent cabinet.

14. The rigging system of claim 13 wherein each of said notches has a different profile to thereby retain adjacent cabinets in predetermined angular relationships with respect to one another.

15. The rigging system of claim 14 wherein said second locking means are removable locking pins.

16. The rigging system of claim 14 wherein said pairs of notches are configured to create an angular adjustment of between approximately 0° to 5° between adjacent cabinets.

17. The rigging system of claim 16 including indicia on each of said rigging disks adjacent said pairs of notches to indicate a predetermined angular relationship between adjacent cabinets.

18. The rigging system of claim 14 wherein each of said pair of rigging disks includes a left hand disk and right hand disk which are structured to be mirror images of one another.

19. The rigging system of claim 8 wherein each rigging disk has a primary and generally arcuate outer wall portion and a linear outer wall portion, said outer openings being provided along said arcuate outer wall portion whereby each of said rigging disks may be rotated such that said linear outer wall portion thereof generally aligns with an adjacent slot in said cabinet such that no portion of said disk protrudes from said housing.

20. The rigging system of claim 8 in which each of said rigging disks includes a first outer opening and a first inner opening which are so positioned relative to one another such that when said first outer openings protrude from said housing and said rigging disks are secured by said second locking means and said first inner openings are secured by said first locking means, said cabinets are aligned with said front output portions substantially in a planar alignment with one another.

21. The rigging system of claim 1 wherein each of said cabinets includes at least one disk engaging stabilizer means mounted within said housing for engaging in spaced notches in said rigging disks to thereby prevent pivotal movement of adjacent cabinets when said rigging disks of one cabinet are inserted within said open slots of an adjacent cabinet.

22. The rigging system of claim 21 wherein said spaced notches of said locking disks are configured to allow adjacent cabinets to be positioned such that the front output portions thereof may be adjusted in an arc of a circle between approximately 0° to 5°.

23. A rigging system for a vertical array of audio speaker cabinets where each cabinet includes an outer housing having a front output portion, rear wall, opposite sides, upper wall and bottom wall, a pair of spaced rigging disks mounted within each of said housings, each of said rigging disks including a plurality of outer openings that are spaced in an arcuate manner about an axis of rotation thereof, each of said disks being selectively rotatable about said axis of rotation relative to said housing so as to have selected outer openings protruding either upwardly through said upper wall or downwardly through said bottom wall, each cabinet including first locking means for securing said disks in a predetermined position therein, second locking means to securely engage within said protruding outer openings of a pair of rigging disks extending from an adjacent cabinet and stabilizer means for engaging said disks such that an angle relative to said front output portions of a vertical array of said cabinets may be selectively varied.

24. A method of angularly connecting adjacent loudspeaker cabinets to one another to form a vertical array wherein each cabinet includes a single pair of rigging disks mounted therein which are rotatable about a rotational axis and which include selective protruding portions which extend outwardly thereof and which disks are selectively locked in a predetermined position by first locking means and wherein the outwardly protruding portions having outer openings therein for selectively receiving second locking means associated with an adjacent cabinet, the method comprising the steps of:

A. rotating, about their axes of rotation, the rigging disks of a first of the cabinets to a selected position relative to the first cabinet such that an outer opening in a protruding portion of the disks extends outwardly of the first cabinet and locking the disks in the selected position;

B. thereafter, inserting the protruding portions of the disks of the first cabinet into a second cabinet so that at least one stabilizer member in said second cabinet engages at least one of the disks, and C. thereafter, inserting second locking elements of the second cabinet into the outer openings in the protruding portions of the disks of the first cabinet to thereby secure the first and second cabinets to one another.

* * * * *